United States Patent [19]
Asanasavest

[11] Patent Number: 5,523,617
[45] Date of Patent: Jun. 4, 1996

[54] FUSE FRAMES, PROGRAMMABLE FUSE FRAMES, AND METHODS FOR PROGRAMMING BY FUSING

[75] Inventor: Chainarong Asanasavest, Santa Clara, Calif.

[73] Assignee: National Semiconductor Corporation, Santa Clara, Calif.

[21] Appl. No.: 364,133

[22] Filed: Dec. 27, 1994

[51] Int. Cl.$^6$ ............................................. H01L 23/495
[52] U.S. Cl. ........................................ 257/666; 257/670
[58] Field of Search .................................. 257/666, 670, 257/669, 677, 668

[56] References Cited

U.S. PATENT DOCUMENTS

| | | | |
|---|---|---|---|
| 4,471,158 | 9/1984 | Roberts | 257/676 |
| 4,587,548 | 5/1986 | Grubbe et al. | 257/668 |

*Primary Examiner*—Sara W. Crane
*Assistant Examiner*—S. V. Clark
*Attorney, Agent, or Firm*—Hickman Beyer & Weaver

[57] ABSTRACT

A fuse frame for use in a semiconductor package is disclosed. A fuse frame includes an external lead arranged for electrically connecting to a first internal element of the semiconductor package and to extend externally from the semiconductor package and an internal lead arranged to be positioned entirely within the semiconductor package is also provided for electrically connecting a second internal element of the semiconductor package to a third internal element of the semiconductor package. A fuse bar supportably connects the internal lead to the external lead. The fuse bar includes a conductive material which fuses when excess current runs through it. A semiconductor package is made of a fuse frame and a die is mounted on the fuse frame such that the die supports the internal lead of the fuse frame. A programmable fuse frame is also disclosed. A programmable fuse frame includes a matrix of fuse bars and lead bars. The fuse bars may be selectively fused to define one or more isolated conductive paths through the programmable fuse frame.

24 Claims, 7 Drawing Sheets

FUSE FRAMES, PROGRAMMABLE FUSE FRAMES, AND METHODS FOR PROGRAMMING BY FUSING

BACKGROUND OF THE INVENTION

The present invention relates generally to leadframes for use in semiconductor packages. More specifically, the invention relates to fuse flames and programmable fuse flames which are fabricated such that internal connections can be made within a semiconductor package and support for the internal connections comes directly from the semiconductor die.

In the field of semiconductor packaging the cost of the components making up the package and the complexity of the manufacturing process are of major concern. Any improvement which simplifies the manufacturing process, improves the durability of the package, or reduces the cost of the components making up a semiconductor package can provide a significant commercial advantage. Also, in order to reduce the amount of material required to produce a given package and reduce the space required by the finished semiconductor package, packages are being made smaller and thinner. Because of these factors, the packaging of semiconductors continuously demands smaller and more cost effective designs and methods for producing semiconductor packages.

In response to these demands, designers in the field of semiconductor packaging have developed multi-chip semiconductor packages. Multi-chip packages include not only semiconductor packages containing more than one die but also so-called hybrid packages which incorporate components based on technology other than semiconductor technology. Representative components include resistors, inductors, capacitors and oscillating crystals. The aforementioned multi-chip packages have in some cases reduced the size and material needed for the packages while expanding their capabilities.

Fabrication methods for single chip semiconductor packages are well known to those skilled in the art of semiconductor packaging and are generally relatively straight forward. Most commonly, a lead frame having an array of electrically conductive leads is used to electrically connect (by way of bonding wires) the internal elements of the single chip to external elements. The lead frame must be supported during both the attachment of the bonding wires and encapsulation of the internal components. To provide the required support, the array of electrically conductive leads are supportably held together by a rail that extends around the periphery. Once the leads are electrically connected to the internal elements, an encapsulant material is formed surrounding the chip and a substantial portion of the lead frame. At this point, the leads no longer require support from the rail which is subsequently trimmed away.

In some situations it is desirable to provide a completely internal connection that is external to a die. By way of example, in multi-chip packages it is common to electrically connect a contact pad of a first semiconductor die with a contact pad of a second semiconductor die. Traditionally, it has been difficult to use lead frames to accomplish such internal connections since the internal lead must be supported in some manner during various processing steps. Thus, current solutions generally require additional fabrication steps such as forming traces on a substrate and/or adding additional components such as a small printed circuit board to provide the necessary traces and support. While operable, these solutions generally result in additional steps, increased material requirements, reliability issues and, inevitably, higher costs. Accordingly, it would be advantageous to provide an economical mechanism that permits lead frames to be used to make internal connections in an economical manner.

SUMMARY OF THE INVENTION

To achieve the foregoing and other objects and in accordance with the purpose of the present invention, a fuse frame is disclosed having an external lead, an internal lead, and a fuse bar supportably connecting the integral lead to the external lead. The external lead is arranged to be positioned in the semiconductor package such that the external lead extends between internal and external portions of the semiconductor package. Furthermore, the external lead must be suitable for connection to a first internal element of the semiconductor package. The internal lead is positioned entirely within the semiconductor package for electrically connecting a second internal element of the semiconductor package to a third internal element. The fuse bar includes a conductive material which fuses when excess current flows therethrough. Thus a current path between the external lead and the internal lead may be broken.

According to one aspect of the present invention, a semiconductor package is made of a fuse frame, as described above, and a die is mounted on the fuse frame such that the die supports the fuse frame. In another embodiment, the semiconductor package contains two die which are mounted bottom surface to bottom surface with the fuse frame sandwiched in-between.

In yet another aspect of the invention, a programmable fuse frame is disclosed for use in a semiconductor package. The programmable fuse frame has a plurality of fuse bars. Each of the fuse bars includes a conductive material which fuses when excess current flows therethrough, thereby breaking a current path. Furthermore, the programmable fuse frame has a plurality of lead bars supportably interconnected with the fuse bars. By fusing selected fuse bars, an isolated conductive path through the programmable fuse frame can be made. This produces an isolated conductive path made of one or more fuse bars which have not been fused and lead bars.

In one method aspect of the present invention, the fuse bars are fused by use of an induction welder. The induction welder is utilized to generate an eddy current within the fuse bars. The eddy current operates to rapidly heat the fuse bar thereby fusing the narrowest path of the fuse bar.

A method for programming the programmable fuse frame is also disclosed in yet another embodiment of the present invention. Initially, a desired conductive path within the programmable fuse frame is determined. Next, an electrical isolation region surrounding the conductive path is determined and all fuse bars included in the isolation region are selected. Finally, the selected fuse bars are fused thereby electrically isolating the conductive path within the programmable fuse frame.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF THE INVENTION

In this description several embodiments of fuse frames and programmable fuse frames along with method aspects of the present invention will be described. The fuse frame and programmable fuse frame can be used to supplement or replace a standard lead frame and can perform all the functions previously performed by the standard lead frame. The present invention can be used to make internal connections in an economical manner without the additional fabrication steps of forming traces on a substrate and/or adding additional components such as a small printed circuit board to provide the necessary traces and support. Additionally, it can be used in combination with such techniques.

Figure 1A:
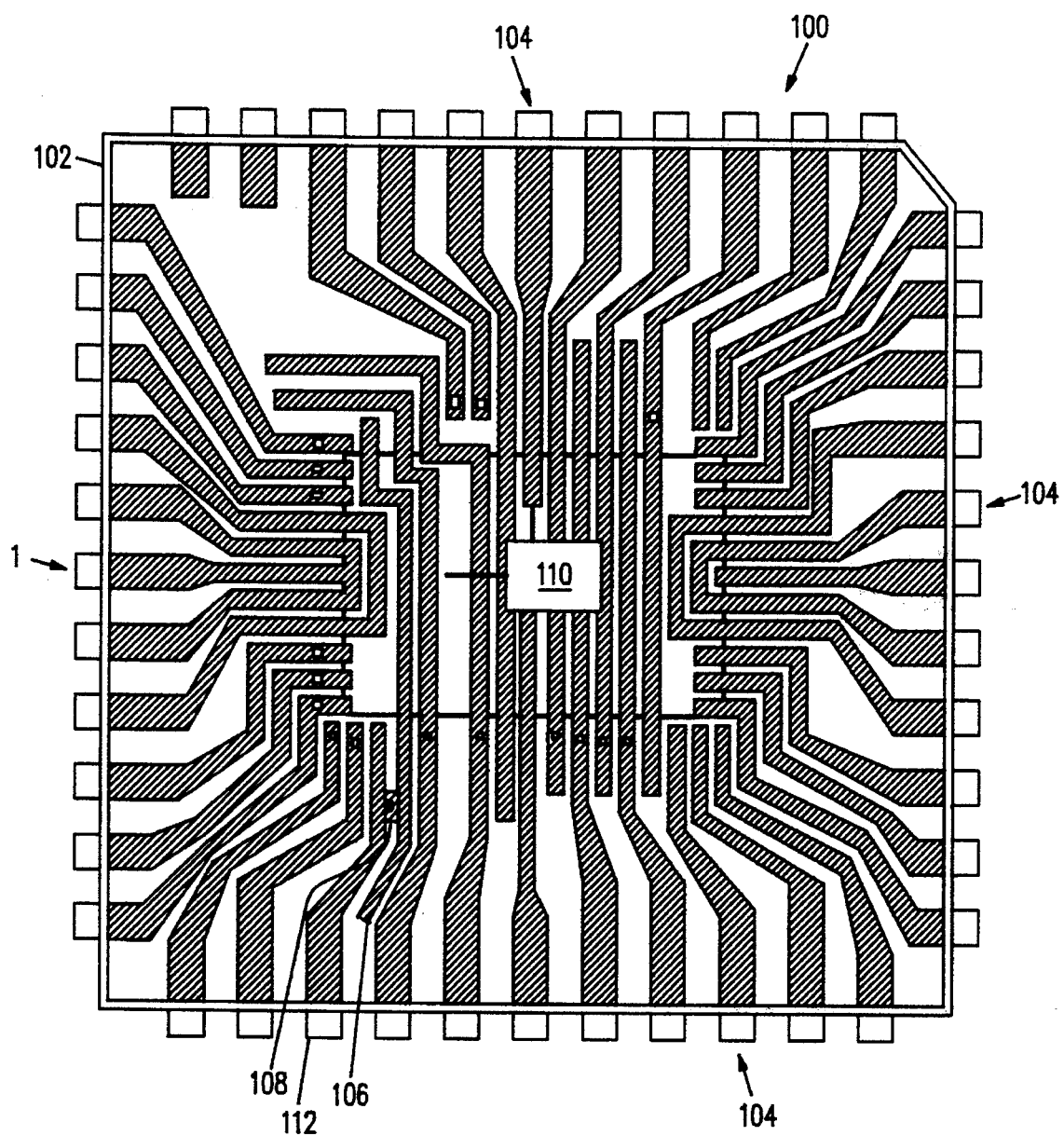
FIG. 1a is a vertical sectional view of a fuse frame with a single internal lead and corresponding fuse bar designed in accordance with the present invention.

Referring initially to FIG. 1a, a fuse frame 100 designed in accordance with one embodiment of the present invention will be discussed. The fuse frame 100 can be used to replace or supplement a conventional lead frame in the fabrication of a semiconductor package. A fuse frame 100 includes a peripheral rail 102, a plurality of external leads 104, an internal lead 106, and a fuse bar 108. A die attach area 110 indicates the region where a semiconductor die 114 (not shown in FIG. 1a) will be mounted. Each of the external leads 104 are supportably attached to the peripheral rail 102 which surrounds the periphery of the fuse frame 100. The external leads 104 are each arranged for electrically connecting corresponding internal elements of the semiconductor package to external connections. Examples of internal elements of a semiconductor package include die contact pads located on one or more dies, resistors, capacitors, inductors, oscillating crystals, diodes, etc.

As shown in FIG. 1a, the internal lead 106 is supportably attached to a corresponding external lead 112 by the fuse bar 108. The internal lead 106 is positioned entirely within the semiconductor package and is utilized for electrically connecting two internal elements of the semiconductor package. As discussed in the background, the need for connecting two internal elements arises often in multi-chip package fabrication. Note that within the fuse frame 100 the only support for the internal lead 106 is the fuse bar 108. It should be appreciated that the fuse frame 100 could include a number of internal leads and fuse bars, all of which are supportably attached to external leads. Additionally, multiple fuse bars attached to different external leads may be provided to support a single internal lead. Similarly, multiple internal leads may be supported in between a pair of external leads or by a single external lead.

In one embodiment, the fuse frame is stamped from a single piece lead frame blank. By way of example, copper and copper alloys work well as the lead frame material. Thus each of the following components, the external leads 104, the internal lead 106 and the fuse bar 108 are made of the same material. Typically this material is very conductive, enabling low resistance electrical connections by utilizing the leads of the fuse frame 100 as a conductive path. Hence the fuse bar 108 is made of conductive material and electrically connects the external lead 112 to the internal lead 106. In order for the semiconductor package to operate properly, at some point the fuse bar 108 must be fused to sever the electrical connection between the external and internal lead. Thus, the internal lead 106 must be supported by another mechanism.

Figure 1B:
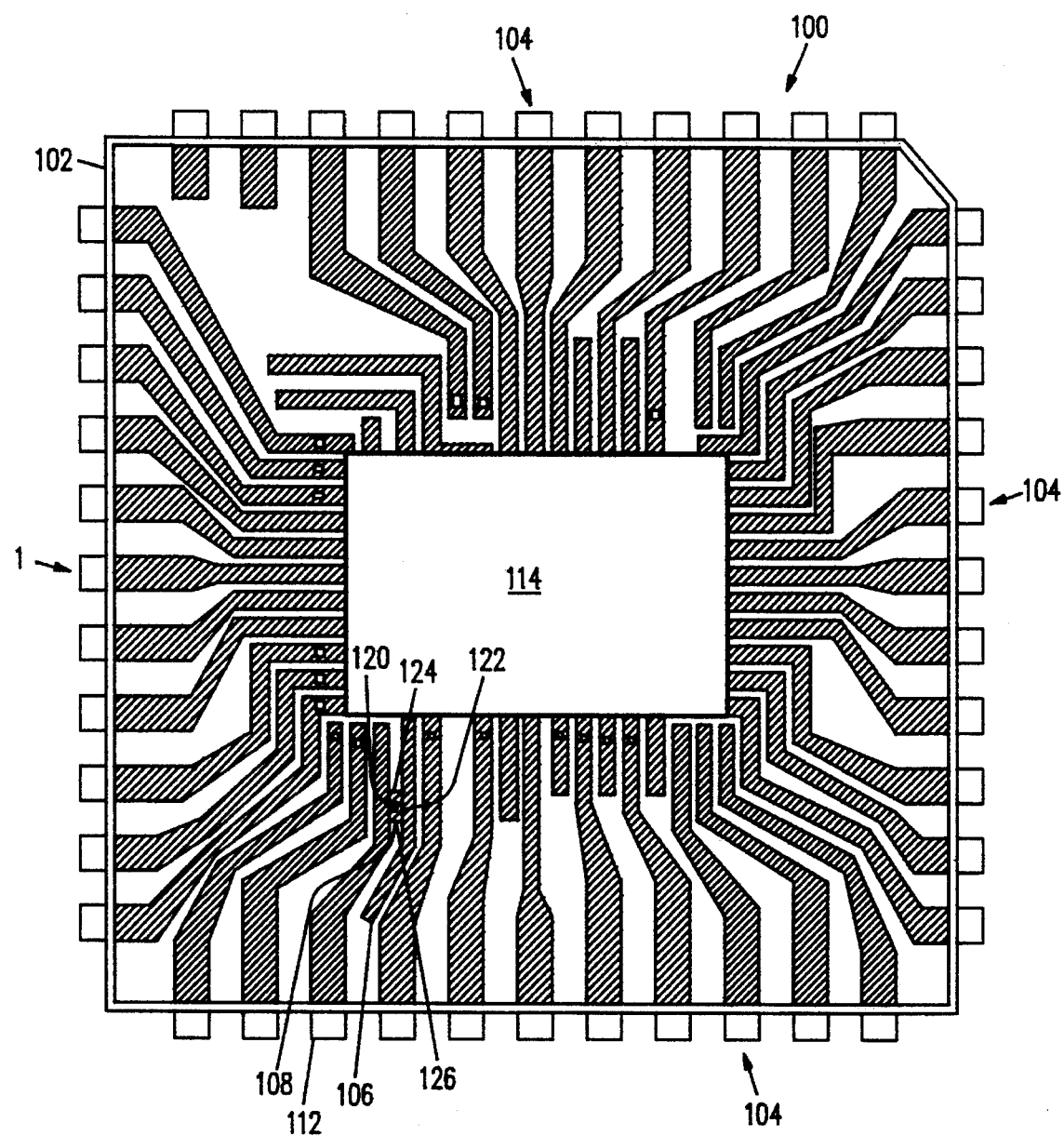
FIG. 1b is a vertical sectional view of the fuse frame illustrated in FIG. 2a with a semiconductor die mounted such that the internal lead is attached to the die.

FIG. 1b shows a fuse frame 100 with a semiconductor die 114 mounted on the die attach area 110. In the embodiment shown, the die 114 is mounted directly over a plurality of leads, including the internal lead 106. Thus, the internal lead 106 is supportably attached to the die 114. Once the internal lead 106 is supportably attached to the die 114, the fuse bar 108 can be fused thereby breaking both the mechanical and electrical connections between the internal lead 106 and the external lead 112. At this point the fuse frame 100 and semiconductor die 114 are ready for additional fabrication steps. Typical steps include electrically connecting the contact pads on the die 114 to the fuse frame 100 via bonding wires, encapsulating the die 114 and most of the fuse frame 106, and trimming the peripheral rail 102. Of course other conventional packaging steps can be incorporated as well. With the described structure, the internal lead 106 can be used to electrically couple two internal elements of the semiconductor package. By way of example, a first contact pad on a first die may be wire bonded to one portion of the internal lead and a second contact pad on a second die may be wire bonded to a second portion of the internal lead 106, thereby electrically coupling the first and second contact pads. The die may be attached to the fuse frame by a suitable die bonding means. For example, non-conductive epoxies work well.

The fuse bar 108 must be designed such that it can be fused after the die 114 is attached. In a preferred embodiment, the fuse bar 108 is made of conductive material and has a width substantially smaller than the width of the components it connects. In this case, a simple method of fusing the fuse bar 108 is to use it as a short circuit and run an excessive current through it. By way of example, a current in the range of approximately 5–10 amperes on a copper fuse bar with a width of approximately 1 mil and a length in the range of approximately 6–10 mils is appropriate. If the fuse bar 108 is sized and shaped properly (relative to the components it connects) the fuse bar 108 will melt (fuse) before any damage occurs to the other components. Of course, damage prevention requires prompt removal of the fusing current after fusing.

In the embodiment illustrated in FIG. 1a, the fuse bar 108 has a first end 120 attached to the external lead 112 and a second end 122 attached to the internal lead 106. Two side sections 124 and 126 electrically connect the first end 120 to the second end 122 and are fabricated such that a generally elliptical aperture is formed within the fuse bar 108. The side section widths are substantially smaller than the widths of the first and second ends. Thus, when electrically fusing, the side sections melt before damaging either the external lead 112 or the internal lead 106. The fused material typically seperates and forms an appendage to both the internal lead 106 and the external lead 112 shaped such that no additional processing is required to clear this material away. It should be appreciated that both size and shape of the fuse bar 108 can vary widely and still achieve the required results. Proper selection of these parameters in conjunction with the fusing mechanism is an important step in the present invention. It should be appreciated that the fuse bar may be formed in the same manner as the rest of the lead frame, as for example, by stamping, etching, molding, or the like.

Figure 2:
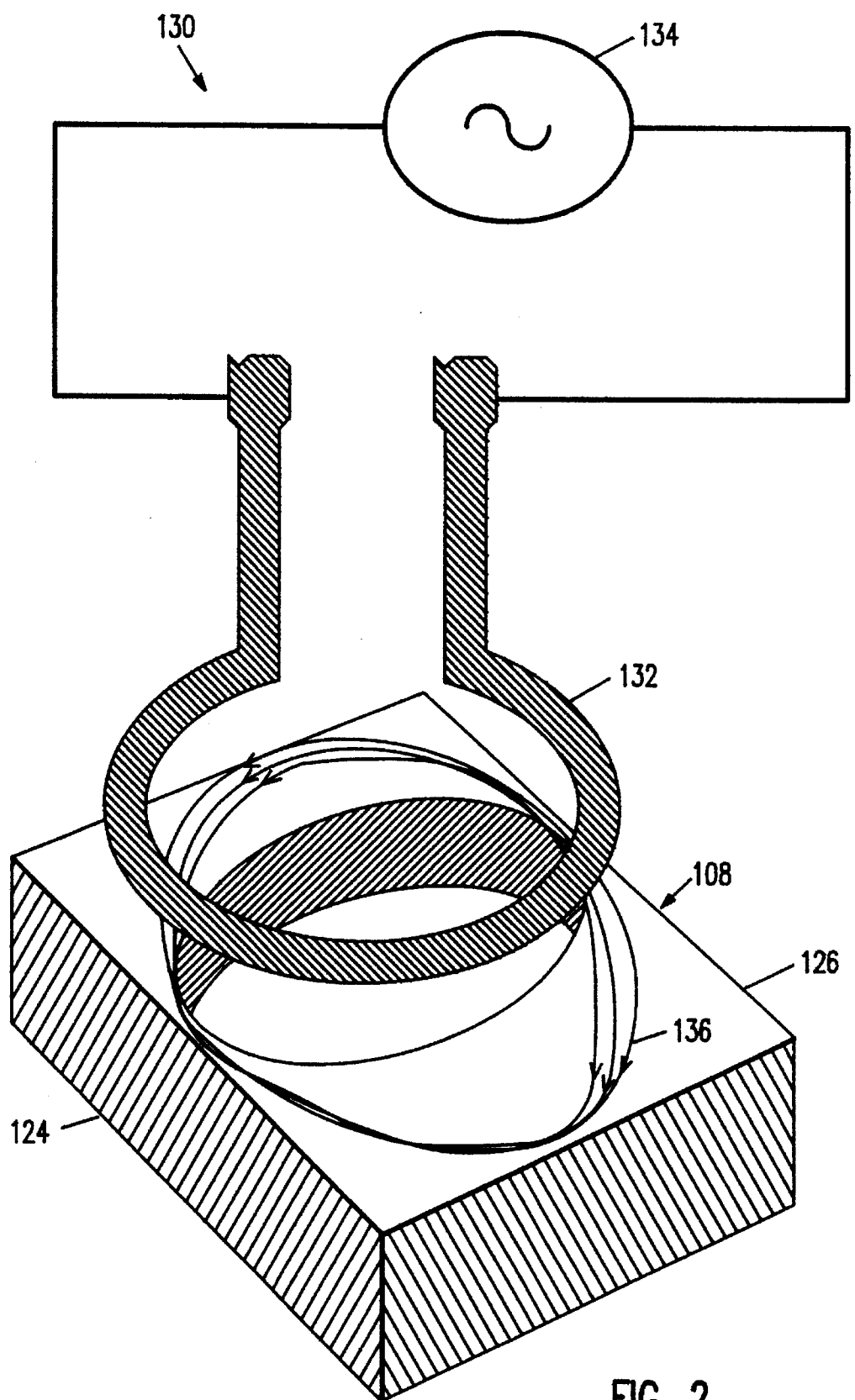
FIG. 2 is a diagrammatic illustration of a induction welder being utilized to fuse a fuse bar.

FIG. 2 illustrates one preferred fusing method which contemplates the use of an induction welder 130 to fuse the fuse bar 108. An induction welder 130 has a single induction coil 132 electrically coupled with a high frequency power supply 134. By positioning the energized induction coil 132 directly above the fuse bar 108 as shown, an eddy current 136 is generated within the fuse bar 108. The eddy current 136 causes the fuse bar 108 to heat rapidly and the thinnest portions melt first. In this case, the side section 124 and 126 will melt first, producing the desired result. It is important to note that the induction welder need only be on until the fuse has occurred, and then should be turned off promptly to prevent damage to other components.

It should be appreciated that the fusing methods of the present invention encompass a wide variety of fuse mechanisms. The previous embodiments are only two specific examples from a family of fuse mechanisms involving the generation of an electrical current through the fuse bar. An even larger family of fuse mechanisms includes embodiments which involve melting the fuse bar to accomplish fusing. One embodiment from this family includes heating the fuse bar through direct contact with a heating element. Yet another embodiment from this family includes focusing a laser on the fuse bar. A different family of fuse mechanisms includes embodiments involving chemical fusing. One specific embodiment from this family includes a standard mask and etch process. A further family of fuse mechanisms includes mechanically fusing the fuse bar. One particular embodiment of this family includes trimming the fuse bar with a shearing device.

Figure 3:
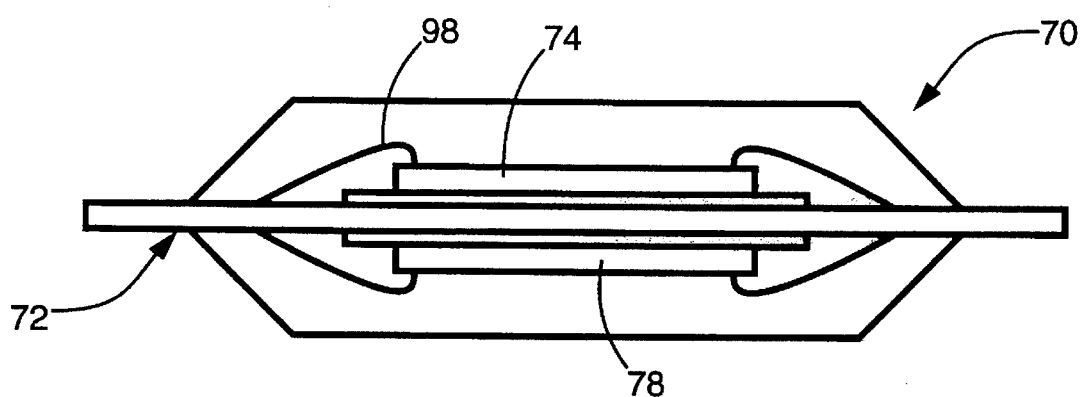
FIG. 3 is a diagrammatic cross-sectional view of a multi-chip semiconductor package designed in accordance with one embodiment of the present invention.

A specific example of how the fuse frame is used within a multi-chip semiconductor package 70 will be discussed with respect to FIG. 3. Initially, the fuse frame is formed using conventional lead frame manufacturing techniques such as stamping, etching or combinations of the two. In large production items, a plurality of lead flames may be formed from a single strip. After the lead flames have been formed, a first die 74 is mounted onto one surface of the fuse frame 72 in the die area. With this arrangement, the internal leads are supportably attached to die 74. Thereafter, a second die 78 is mounted in the die area on the opposite surface of the lead frame 72. The first and second die may be attached to the fuse frame using any suitable die bonding techniques. With the die properly attached, the fuse bars are fused by any suitable fusing technique such as the techniques discussed above. This serves to both electrically and mechanically isolate the internal leads from their supporting external leads. Thereafter, die 74 and 78 are electrically connected to the lead frame by wire bonding using a multiplicity of bonding wires 98. Thereafter, the die, bonding wires and portions of the lead frame are encapsulated in a suitable package. As will be appreciated by those skilled in the art, the idea of coupling die to both sides of a lead frame is new to the art as well. A technique suitable for coupling a plurality of die to two opposite sides of a lead frame is described in more detail by Matthew et al. in co-pending application Ser. No. 08/329,997, filed Oct. 27, 1994 which is incorporated herein by reference in its entirety.

Another embodiment of the present invention which contemplates a programmable fuse frame will be described next. As will be apparent, the potential benefits of using a programmable fuse frame within a semiconductor package are similar to those described in the preceding discussion of the fuse frame. However, there are certain semiconductor package designs in which the programmable fuse frame embodiment may provide superior performance over the simple fuse frame (and vice versa). In the situation where customized internal electrical connections are needed, the required internal leads and corresponding fuse bars may prove cumbersome. An alternative to the fuse frame is to fabricate a programmable fuse frame with a programmable region, then program it as needed. Besides increasing the potential number of internal leads, the programmable fuse frame is adaptable to different packaging designs.

In general, a programmable fuse frame of the present invention includes fuse bars and lead bars and is formed using conventional lead frame manufacturing techniques such as stamping, etching or combinations of the two. The components of the programmable fuse frame are interconnected such that, by fusing selected fuse bars, one or more electrically isolated conductive paths can be programmed within the programmable fuse frame. A conductive path within the programmable fuse frame can be utilized to electrically couple any combination of semiconductor device elements. By way of example, a first contact pad on a first die may be wire bonded to one portion of the programmable fuse frame and a second contact pad on a second die may be wire bonded to a second portion of the programmable fuse frame, thereby electrically coupling the first and second contact pads. As another example, a contact pad on a die could be wire bonded to a portion of the programmable fuse frame which, after proper programming, enables connection to an external portion of the semiconductor device. Thus the programmable fuse frame can be programmed to provide a function substantially identical to the function of the standard lead frame.

Typically, the programmable region of the programmable fuse frame includes that portion which may be programmed. It should be appreciated that the programmable region can embody many different forms within the scope of the present invention. The size and shape of the components in the programmable region may vary, including variation within a specific embodiment. Further, the geometry of the programmable fuse frame, including the programmable region, can vary greatly within the scope of the present invention.

Figure 4:
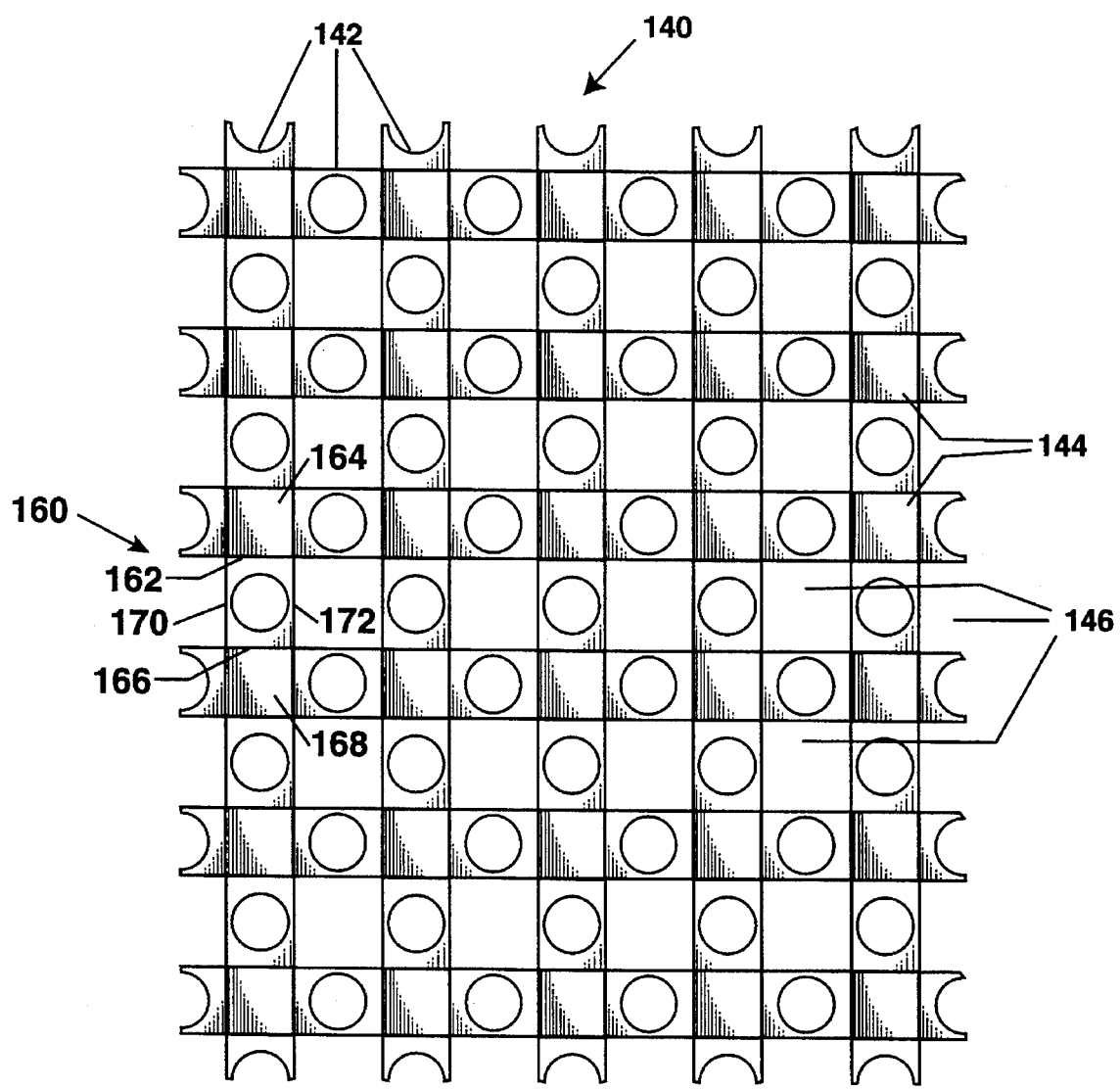
FIG. 4 is a vertical sectional view of an unprogrammed programmable region of a programmable fuse frame designed in accordance with a second embodiment of the present invention.

By way of example, FIG. 4 illustrates one embodiment of a programmable region 140 of a programmable fuse frame. The programmable region 140 includes a multiplicity of fuse bars 142 and a multiplicity of lead bars 144. In the embodiment of FIG. 4, the fuse bars 142 and the lead bars 144 are supportably interconnected in a grid-like structure such that a multiplicity of isolation openings 146 are formed between them. When programmed, the fused fuse bars and isolation openings 146 will form an isolation region immediately surrounding a conductive path.

In the embodiment illustrated in FIG. 4, a multiplicity of fuse bars 160 are provided. Each fuse bar 160 has a first end 162 attached to a first lead bar 164 and a second end 166 attached to a second lead bar 168. Two side sections 170 and 172 electrically connect the first end 162 to the second end 166 and are fabricated such that a generally elliptical aperture is formed within the fuse bar 160. The side section widths are substantially smaller than the widths of the first and second ends. Thus, when electrically fusing, the side sections melt before damaging either the first lead bar 164 or the second lead bar 168. It should be appreciated that while both size and shape of each of the fuse bars within the programmable fuse frame can vary widely and still achieve the required results, proper selection of these parameters in conjunction with the fusing mechanism is an important step in the present invention.

Figure 6:
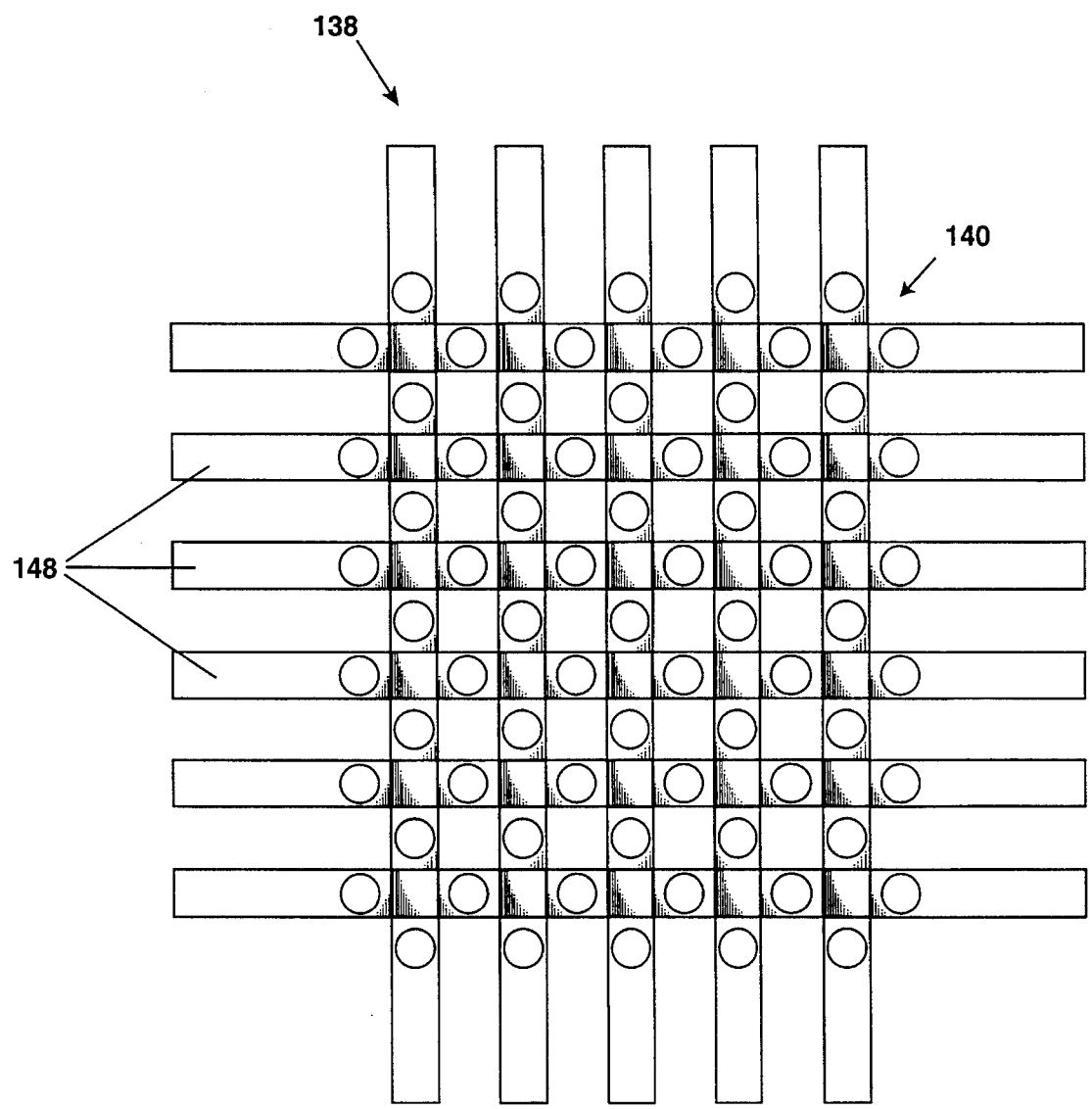
FIG. 6 is a vertical sectional view of a programmable fuse frame including a programmable region and a plurality of external leads, the programmable fuse frame designed in accordance with a third embodiment of the present invention.

An alternative embodiment of a programmable fuse frame is illustrated in FIG. 6. This programmable fuse frame includes a plurality of external leads 148 which are supportably attached to the programmable region 140 via the fuse bars. Thus all the components of the programmable region 140 can be supported by a peripheral rail (not shown) until another support mechanism is provided. In a further embodiment, the programmable region 140 encompasses the die attach area of the programmable fuse frame where a die will be mounted. The mounted die can than provide support for the programmable fuse frame. In another embodiment, the entire programmable fuse frame 138 is programmable, thereby providing additional flexibility in programming the frame.

In one embodiment, the programmable fuse frame is stamped from a single piece lead frame blank. By way of example, copper and copper alloys work well as the lead frame material. Thus each of the following components, the fuse bars 142, the lead bars 144, and the external leads 148 are made of the same material. Typically this material is very conductive, enabling low resistance electrical connections by utilizing the leads of the programmable fuse frame 138 as a conductive path. Hence the fuse bars 142 are made of conductive material and, prior to programming, electrically connect the lead bars 144 and the external leads 148 (if the external leads exist). In order for the semiconductor package to operate properly, at some point the programmable region 140 must be programmed, thereby severing any unwanted electrical connections between the external leads, fuse bars, and lead bars. Thus, all the components must be supported by another mechanism.

The fuse bars 142 of the programmable region 140 must be designed such that they can be fused after a die is attached. In a preferred embodiment, each fuse bar is made of conductive material and has a geometry such that it contains much less material than the components it connects. In this case, a simple method of fusing each fuse bar is to use it as a short circuit and run an excessive current through it. By way of example, a current in the range of approximately 5–10 amperes on a copper fuse bar with a width of approximately 1 mil and a thickness in the range of approximately 6–10 mil is appropriate. If each fuse bar is sized and shaped properly (relative to the components it connects) each fuse bar will melt (fuse) before any damage occurs to the other components. Of course, damage prevention requires prompt removal of the fusing current after fusing.

The fusing methods discussed previously with respect to the fuse bar of the fuse frame apply equally well to the fuse bars of the programmable fuse frame. These fusing mechanisms include, but are in no way limited to, melting the fuse bar by any method (such as running a relatively high current through the fuse bar), chemical fusing, and mechanical fusing. Additionally, any fusing method may be modified to provide a fusing method specifically adapted for the multiplicity of fuse bars which may require fusing. By way of example, one embodiment would utilize an array of induction welders, each one similar to induction welder 130 of FIG. 2. The induction welders of this embodiment would be arranged such that all the selected fuse bars could be simultaneously fused, thereby providing a time efficient method for programming the programmable fuse frame. A similar principle could be applied to any of the other fuse mechanisms discussed previously.

Figure 5:
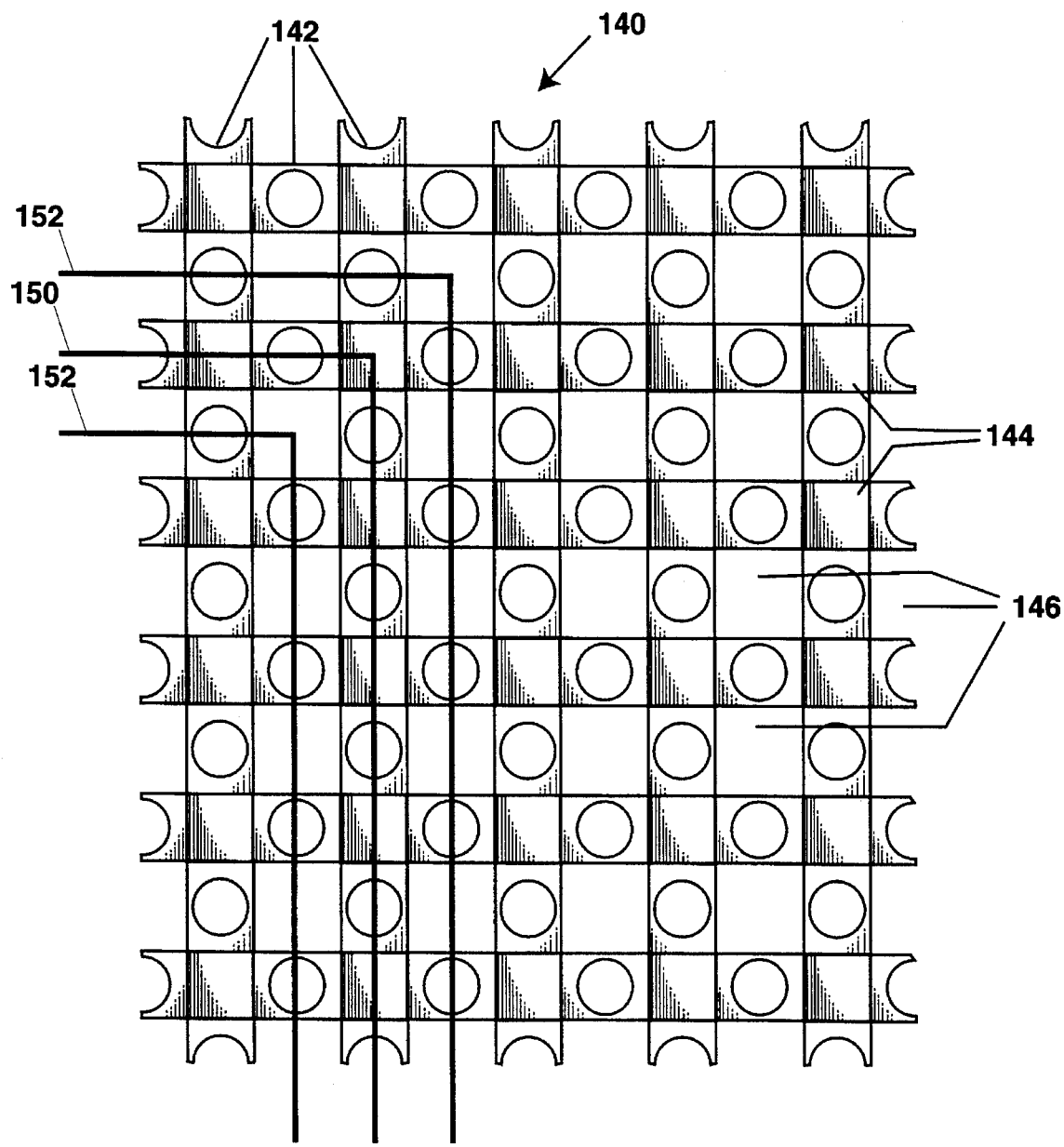
FIG. 5 is a vertical sectional view of the programmable fuse frame illustrated in FIG. 4 with both the conductive path and the isolation region indicated by lines.

One programming aspect of the present invention will now be discussed with respect to FIG. 5. As shown in FIG. 5, an early step in programming the programmable region 140 is to determine a desired conductive path 150. As the conductive path 150 will electrically connect two elements of a semiconductor package, it must include only fuse bars and lead bars. In another step, an electrical isolation region 152 surrounding the conductive path is identified and each of the fuse bars 144 included in the electrical isolation region 152 are selected. Note that the electrical isolation region 152 contains only the fuse bars 144 and isolation openings 146. After the fuse bars 144 are selected, they are fused in order to electrically isolate the conductive path 150 within the programmable fuse frame.

A specific example of how a programmable fuse frame may be used within a multichip semiconductor package will be discussed next. Initially, the programmable fuse frame is formed using conventional lead frame manufacturing techniques such as stamping, etching or combinations of the two. In large production items, a plurality of programmable fuse frames may be formed from a single strip. After the lead frames have been formed, one or more dies are mounted onto one surface of the programmable fuse frame in the die attach area. With this arrangement, the programmable region is supportably attached to the die. With the die properly attached, the programmable fuse frame can be programmed utilizing one of the fusing methods discussed above. In embodiments that include dies mounted on both sides of the lead frame another die may be mounted on the opposite surface of the lead frame. The dies may be attached to the programmable fuse frame using any suitable die bonding techniques. Thereafter, the dies are electrically connected to the lead frame by using any suitable technique such as wire bonding. Following that, the dies, bonding wires and portions of the lead frame are encapsulated in a suitable package.

There are additional advantages which can be derived from the adaptability of the programmable fuse frame. One particularly noteworthy feature is that one programmable fuse frame design could be utilized across a number of different semiconductor packages. Rather than retooling an assembly line to make different lead flames, the same programmable fuse frame design could simply be programmed differently for each different semiconductor package design.

Although only a few embodiments of the present invention have been described, it should be understood that the present invention may be embodied in many other specific forms without departing from the spirit or scope of the invention. For example, although the invention has been described as it applies to fuse bars that couple internal and external elements, the described fuse bars may also be applied to embodiments wherein multiple internal leads are supported by an external lead or the external leads are coupled together with a fuse bar for support. Further, the shape of the fuse bar(s) can vary greatly and still achieve the requirement of being fusible. It should also be appreciated that the configuration of the programmable region can take on multiple embodiments, all of which lie within the scope of the present invention. Furthermore, the method of mounting a die on the fuse frame or the programmable fuse frame could be any mounting method which nonconductively supports the internal lead.

Additionally, the invention has been described primarily in the context of multi-chip packages (irrespective of whether these take the form of packages with multiple dies or hybrid packages). However, it should be appreciated that the invention may also find application in cases wherein a single chip is being packaged. Therefore, the present examples are to be considered as illustrative and not restrictive, and the invention is not to be limited to the details given herein, but may be modified within the scope of the appended claims.

What is claimed is:

1. A fuse frame for use in a semiconductor package, said fuse frame comprising:

an external lead arranged to be positioned in the semiconductor package such that the external lead extends between internal and external portions of the semiconductor package, the external lead being suitable for connection to a first internal element of the semiconductor package;

an internal lead arranged to be positioned entirely within the semiconductor package for electrically connecting a second internal element of the semiconductor package to a third internal element of the semiconductor package; and a fuse bar supportably connecting the internal lead to the external lead, the fuse bar including a conductive material which fuses when excess current flows therethrough, thereby breaking a current path between the external lead and the internal lead.

2. A semiconductor package comprising:

a fuse frame as described in claim 1; and a die mounted on the fuse frame such that the die supports the fuse frame.

3. A semiconductor package as described in claim 2 wherein said semiconductor package is a hybrid package and said internal elements are selected from the group consisting of die contact pads on said die, a capacitor, a resistor, an inductor, a crystal and a diode.

4. A semiconductor package as described in claim 2 wherein said semiconductor package is a multi-chip package that includes a plurality of die.

5. A semiconductor package as described in claim 4 wherein said second internal element is a die contact pad on a first one of the die and said third internal element is a die contact pad on a second one of the die.

6. A semiconductor package as described in claim 5 wherein said internal lead is supportably attached to at least one of said first and second die.

7. A fuse frame as described in claim 1 wherein said fuse frame is formed from one piece of material such that said external lead, said internal lead, and said fuse bar are formed of the same material.

8. A fuse frame as described in claim 7 wherein said fuse frame is made of a material that includes copper.

9. A fuse frame as described in claim 1, wherein said fuse bar further comprises:

a first end attached to the external lead;

a second end attached to the internal lead; and two side sections electrically connecting the first end to the second end and constructed so that an aperture is formed therebetween, said side sections having widths substantially smaller than widths of said first and second ends wherein, upon fusing the fuse bar, the side sections fuse first thereby breaking the current path without fusing either the external lead or the internal lead.

10. A fuse frame as described in claim 9 wherein said side section widths are less than approximately 0.25 mil and said end widths are greater than approximately 0.75 mil.

11. A fuse frame as described in claim 9 wherein said aperture is generally elliptical.

12. A programmable fuse frame for use in a semiconductor package, said programmable fuse frame comprising:

a plurality of fuse bars, each of said fuse bars including a conductive material which fuses when excess current flows therethrough, thereby breaking a current path through the fuse bar; and a plurality of lead bars supportably interconnected with said fuse bars, whereby an isolated conductive path may be formed through the programmable fuse frame by fusing selected fuse bars, the isolated conductive path being defined as at least one fuse bar which has not been fused and at least one lead bar.

13. A semiconductor package comprising:

a programmable fuse frame as described in claim 12; and a die mounted on the programmable fuse frame.

14. A semiconductor package as described in claim 13 wherein said semiconductor package includes a plurality of internal elements and the isolated conductive path electrically connects a first one of the internal elements to a second one of the internal elements.

15. A semiconductor package as described in claim 13 further comprising a plurality of die.

16. A semiconductor package as described in claim 15 wherein a bottom surface of first one of the die is mounted upon an upper surface of the programmable fuse frame and a bottom surface of a second one of the die is mounted on a lower surface of the programmable fuse frame.

17. A semiconductor package as described in claim 16 wherein said first internal element is a contact pad of said first die and said second internal element is a contact pad of said second die.

18. A semiconductor package as described in claim 16 wherein said programmable fuse frame is supportably attached to at least one of said first and second die.

19. A programmable fuse frame as described in claim 12 wherein said programmable fuse frame is formed from one piece of material such that said lead bars and said fuse bars are formed of the same material.

20. A fuse frame as described in claim 19 wherein said fuse frame is made of a material which includes copper.

21. A programmable fuse frame as described in claim 12, wherein each fuse bar further comprises:

a first end attached to a first lead bar;

a second end attached to a second lead bar; and two side sections electrically connecting the first end to the second end and constructed so that an aperture is formed therebetween, said side sections having widths substantially smaller than widths of said first and second ends, wherein, upon fusing the fuse bar, the side sections fuse first thereby breaking the current path without fusing either the first lead bar or the second lead bar.

22. A programmable fuse frame as described in claim 21 wherein said side section widths are less than approximately 0.25 mil and said end widths are greater than approximately 0.75 mil.

23. A programmable fuse frame as described in claim 20 wherein said aperture is generally elliptical.

24. A lead frame for use in a semiconductor package, said lead frame comprising:

a plurality of external leads arranged to be positioned in the semiconductor package such that each external lead extends between internal and external portions of the semiconductor package, each external lead being suitable for connecting to an internal element of the semiconductor package; and a programmable fuse frame as described in claim 12.

* * * * *

UNITED STATES PATENT AND TRADEMARK OFFICE
CERTIFICATE OF CORRECTION

PATENT NO. : 5,523,617
DATED : June 4, 1996
INVENTOR(S) : Chainarong Asanasavest It is certified that error appears in the above-indentified patent and that said Letters Patent is hereby corrected as shown below:

Column 1, line 9, replace the first and second occurence of "flames" with --frames--

Column 2, line 14, replace "integral" with --internal--

Column 5, line 51, replace "flames" with --frames--

Column 5, line 52, replace "flames" with --frames--

Column 8, line 26, replace "multichip" with --multi-chip--

Column 8, line 52, replace "flames" with --frames--

Column 9, line 5, replace "nonconductively" with --non-conductively--

Signed and Sealed this

Twenty-seventh Day of August, 1996

Attest:

BRUCE LEHMAN

Attesting Officer     Commissioner of Patents and Trademarks